United States Patent [19]

Olsson

[11] 4,318,169
[45] Mar. 2, 1982

[54] SUSPENSION-MOUNTED STATIC ELECTRICAL CONVERTER

[75] Inventor: Karl E. Olsson, Ludvika, Sweden

[73] Assignee: Asea Aktiebolag, Vesteras, Sweden

[21] Appl. No.: 131,725

[22] Filed: Mar. 19, 1980

[30] Foreign Application Priority Data

Mar. 27, 1979 [SE] Sweden .............................. 7902706

[51] Int. Cl.³ ........................................... H02M 7/757
[52] U.S. Cl. .................................... 363/123; 174/42; 363/144
[58] Field of Search .................... 363/13, 35, 68, 129, 363/141, 144, 126, 123; 174/43, 150, 42

[56] References Cited

U.S. PATENT DOCUMENTS

| 1,694,151 | 12/1928 | Waite | 363/141 |
| 2,989,579 | 6/1961 | Somes | 174/99 |
| 3,184,646 | 5/1965 | Diebold | 363/144 |
| 3,258,651 | 6/1966 | Lomar | |
| 3,358,220 | 12/1967 | Fahlen et al. | 174/150 |
| 3,504,268 | 3/1970 | Hoffmann et al. | 363/141 |
| 3,726,986 | 4/1973 | Higaki et al. | 174/43 |
| 4,090,233 | 5/1978 | Thiele et al. | 363/144 |

FOREIGN PATENT DOCUMENTS

| 644063 | 4/1937 | Fed. Rep. of Germany | 363/141 |
| 194816 | 3/1965 | Sweden . | |
| 376869 | 7/1932 | United Kingdom . | |
| 1264910 | 2/1972 | United Kingdom | 363/35 |
| 702150 | 12/1979 | U.S.S.R. . | |

OTHER PUBLICATIONS

M. N. Andreevsky, "Construction of Members of Radio Transmitters Mounted in Movable Objects", Publishing House, Oborongiz, 1959, pp. 21, 22, (Russian).

Primary Examiner—William H. Beha, Jr.
Attorney, Agent, or Firm—Pollock, Vande Sande & Priddy

[57] ABSTRACT

A static electrical converter, preferably for high voltage, has at least one valve assembly each having a single valve or a plurality of electrically series-connected valves. The valve assembly is provided with suspension members at its upper end, so that the valve assembly can be suspended from a supporting structure.

17 Claims, 14 Drawing Figures

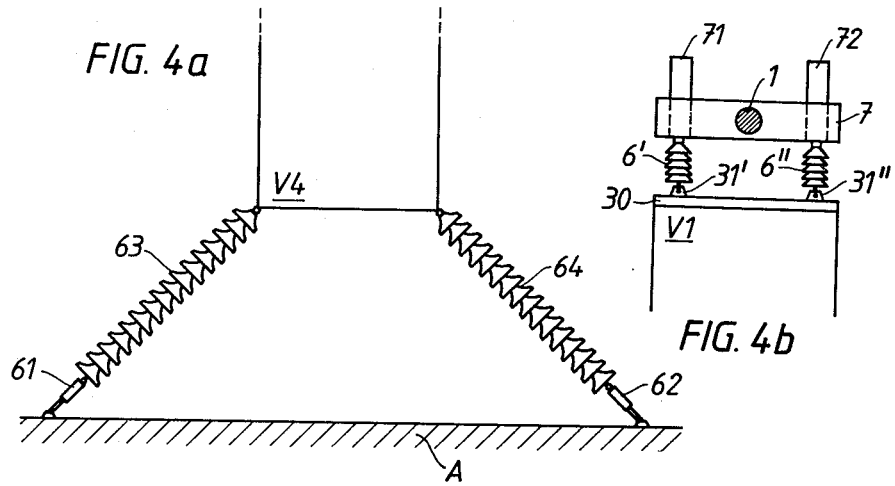
FIG. 4a
FIG. 4b
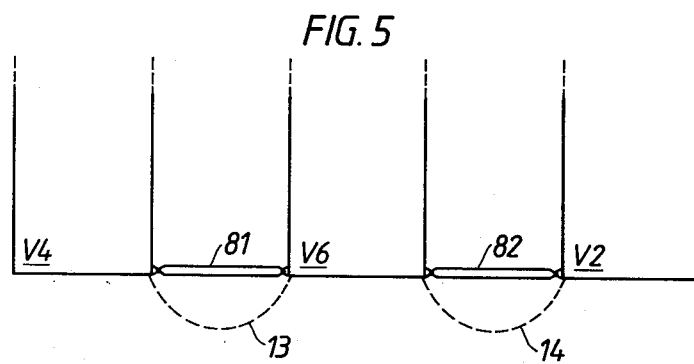
FIG. 5
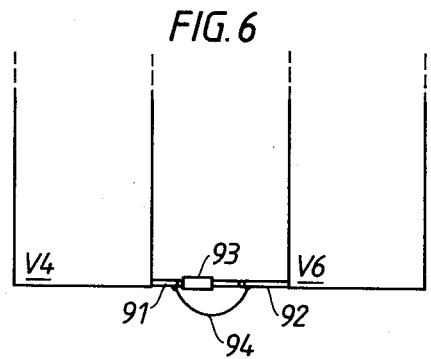
FIG. 6

SUSPENSION-MOUNTED STATIC ELECTRICAL CONVERTER

CROSS-REFERENCES TO RELATED APPLICATIONS

The subject matter of the present application is related to that disclosed in U.S. patent application Ser. No. 131,345, filed Mar. 19, 1980, now U.S. Pat. No. 4,277,639.

TECHNICAL FIELD

This invention relates to a static electrical converter of the kind comprising at least one valve assembly having a single valve or a plurality of electrically series-connected valves.

BACKGROUND ART

In converters of this kind for high voltages it is previously known to build the valve assembly or assemblies in the form of one or more vertical columns standing on a base, with the valves of a valve assembly resting on top of each other. Especially at high voltages and in the case of converters having two or more bridges which are series-connected on their d.c. sides, each valve assembly will be very tall.

Each valve must have vertical supporting insulators between its two ends, which provide the necessary electrical insulation between the ends of the valve and which may take up forces from valves positioned above it. When the valve assemblies are tall, these forces are great and the supporting insulators must then be heavily dimensioned and are expensive and bulky.

In certain cases, for example if the valve assembly has to be dimensioned to withstand seismic forces or when positioning the converter on a movable base, the dimensioning forces on the supporting insulators become so great that it is difficult or impossible to construct sufficiently strong valve assembles with the prior art technique. Such conditions can arise, for example, in the case of marine installations, by which we mean not only ship installations, but also, for example, installations on oil or gas platforms, where the movements caused by waves, especially during transportation of the platform, may be considerable.

Valve assemblies built up in the manner described above often acquire a mechanical natural frequency which may coincide with the frequency of the movements of the base that may occur, for example during earthquakes. This circumstance may give rise to resonance phenomena and a sharp increase of the mechanical stresses on a valve assembly.

In addition to stresses caused by movements of the base, a valve assembly may be subjected to strong mechanical stresses, for example, when carrying out testing and service.

In addition to the supporting insulators included in the individual valves, such insulators are often positioned at the very bottom of a valve assembly, the whole assembly resting on these insulators which provide electrical insulation between the lower end of the assembly and ground. These insulators are subjected to very great forces, which further accentuates the problems mentioned above.

A valve assembly of the known type described above is usually constructed from a number of sections mounted on top of each other, each section having a metal frame at its upper and lower ends, between which supporting insulators are arranged. These frames complicate the valve assembly and render it more expensive. Furthermore, for reasons of electrical strength, these frames make it necessary to make the assembly taller than if no frames had been used, which involves considerable disadvantages from the points of view of economy and strength.

The present invention aims to provide a converter in which the valve assembly or assemblies may be constructed in a simpler and more economically advantageous manner than before and in which even tall assemblies may be caused to withstand forces caused by possible movements of a base on which the converter is located. Another aim of the invention is to provide a converter having a valve assembly of reduced height compared with previously known designs.

DISCLOSURE OF INVENTION

According to the invention, a static electrical converter comprises at least one valve assembly having a single valve or a plurality of electrically series-connected valves, and suspension means at the upper end of said valve assembly, whereby the valve assembly may be suspended from a supporting structure.

BRIEF DESCRIPTION OF DRAWINGS

The invention will now be described, by way of example, with reference to the accompanying drawings, in which FIGS. 5 and 6 are views of the lower ends of the valve assemblies of the converter of FIGS. 1a, 1b, showing different ways in which these ends may be connected together, FIG. 9b is a side view corresponding to FIG. 9a.

DESCRIPTION OF PREFERRED EMBODIMENTS

Figure 1A:
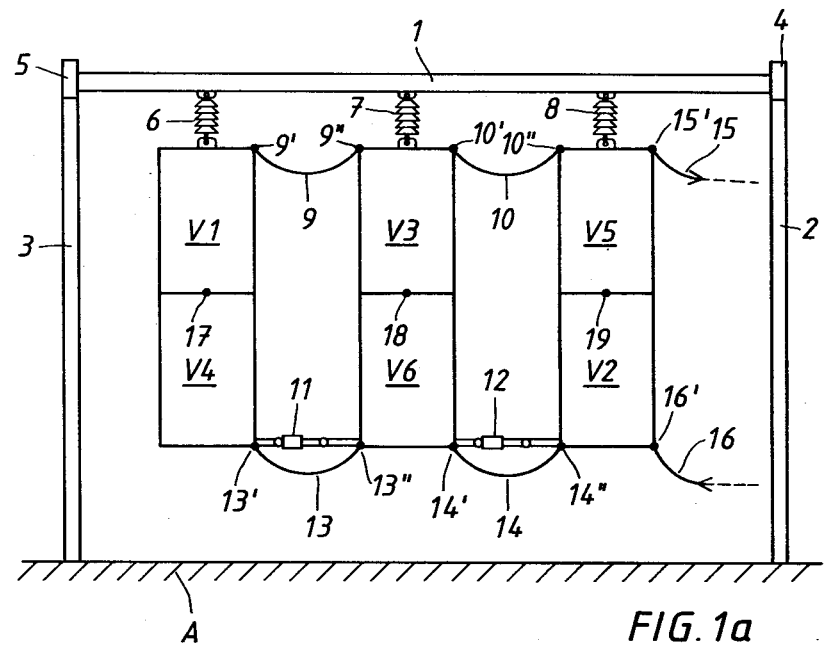
FIG. 1a is a front elevational view of one embodiment of a static electrical converter in accordance with the invention, but with the converter transformer omitted.
Figure 1B:
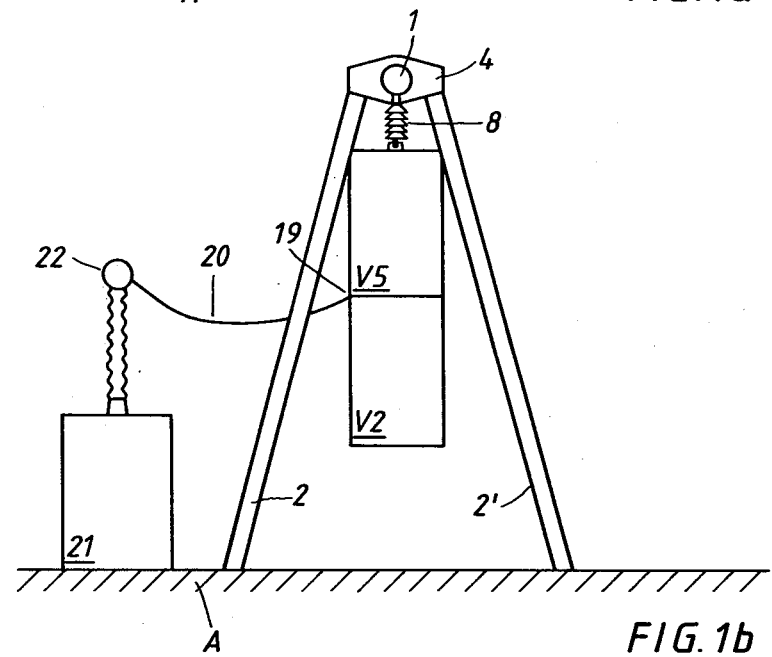
FIG. 1b is an end view of the converter of FIG. 1a, but also showing the converter transformer.

The converter shown in FIGS. 1a and 1b has six valves V1–V6, which in pairs form the three valve assemblies V1, V4, V3, V6 and V5, V2 of the converter. Each valve assembly forms a vertical column with the valves in the assembly positioned one above the other. Each valve assembly is suspended from a respective suspension insulator 6–8, with the aid of a lug or the like arranged at the upper end of the assembly. The lower valve of each assembly is suspended from the upper valve. The valves are therefore only subjected to tensile stresse, which, as will be explained hereinafter, makes possible a simple and advantageous design of the converter.

The valve assemblies are suspended from a trestle consisting of two pairs of legs 2, 3, the upper ends of which are joined together by yokes 4 and 5, and a horizontal tube or beam 1, to which the upper ends of the suspension insulators 6–8 are fixed.

The upper ends of the valve assemblies are provided with connection points 9', 9'', 10', 10'', which are electrically connected by means of lines 9 and 10. The lower ends of the valve assemblies have connection points 13', 13'', 14', 14'' connected together in the same way by means of lines 13 and 14. The upper end of the valve V5 has a connection point 15', to which is fixed a line 15 and which constitutes one of the d.c. terminals of the converter. The lower end of the valve V2 has, in the same way, a connection point 16', to which is fixed a line 16 which constitutes the second d.c. terminal of the converter.

The whole converter rests on a base A, which may be the ground, a special foundation or, in the case of a marine installation, a deck.

The converter transformer 21 shown only in FIG. 1b, is positioned on the base A close to the trestle. The transformer 21 has three phase outputs which are connected by way of a connection means 22 and lines, such as the line 20, to the three a.c. connections 17, 18, 19 of the converter.

For damping oscillating movements of the valve assemblies, damping members 11 and 12, for example hydraulic dampers, are arranged between the lower ends of the valve assemblies.

Figure 2:
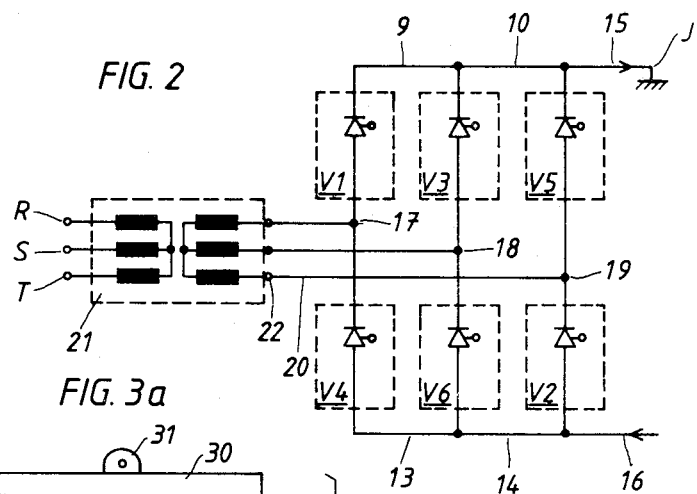
FIG. 2 is a circuit diagram showing the electrical connections of the converter of FIGS. 1a, 1b.

FIG. 2 shows the electrical connection of the converter according to FIG. 1. The converter is a three-phase thyristor bridge, in which the valves V1–V6 constitute the six branches of the bridge. The converter transformer 21 has connections R, S, T for connection to a three-phase a.c. network or other a.c. source, and the converter side of the transformer has three terminals which are connected to the a.c. terminals 17, 18, 19 of the bridge. The upper d.c. terminal of the bridge is intended for connection to a ground electrode J via a line 15, and the upper ends of the valve assemblies will therefore only have a low voltage to ground, which considerably reduces the demand for electrical insulation of the suspension members of the assemblies. Thus, the suspension insulators 6, 7, 8 in FIG. 1a need only be dimensioned for low voltage and may possibly be completely eliminated. The lower d.c. terminal of the bridge has a high voltage to ground and is intended for connection via a line 16 to a d.c. cable or conductor. Since the lower ends of the assemblies are suspended freely, they do not need any insulators dimensioned for this high voltage. The only precaution to be observed is that the distance between the lower ends of the valve assemblies and the surrounding objects at ground potential (the trestle and the base A) is sufficiently large.

Figure 3A:
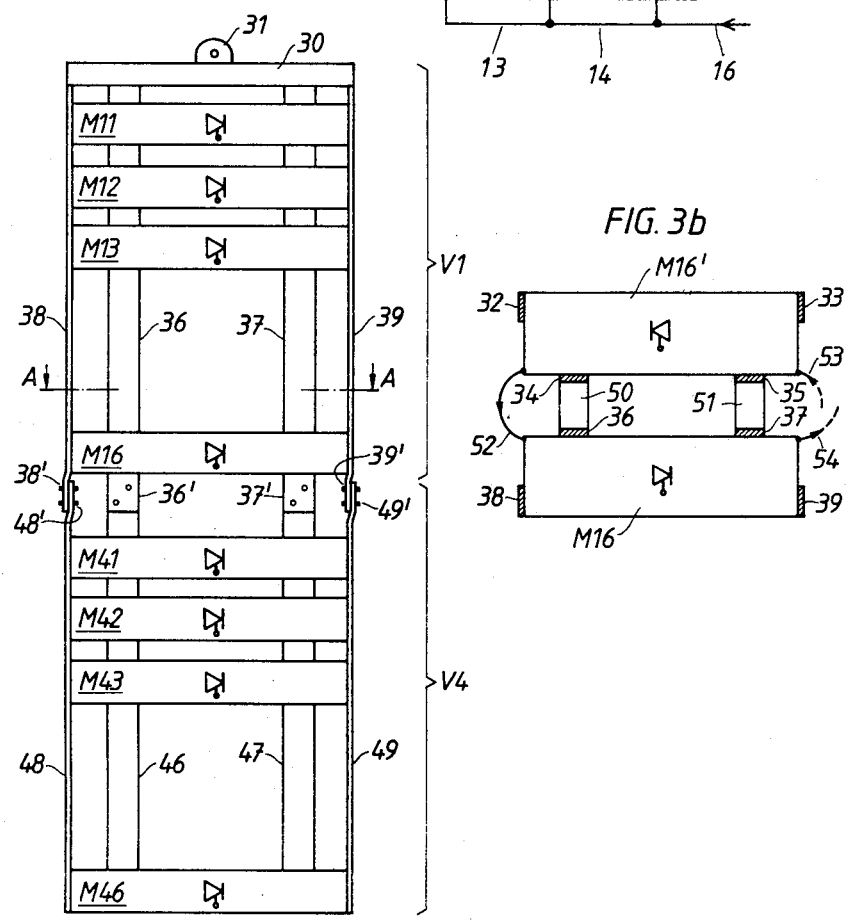
FIG. 3a is a side view, on an enlarged scale, of one of the valve assemblies of the converter of FIGS. 1a, 1b.
Figure 3B:
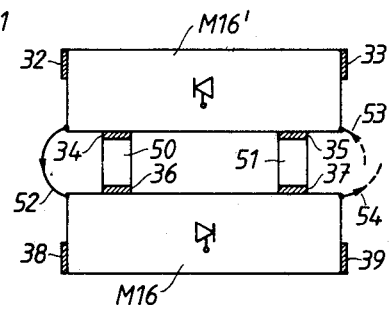
FIG. 3b is a sectional view taken on the line A—A of FIG. 3a, FIGS. 4a and 4b are views of the lower and upper ends, respectively, of a valve assembly of the converter of FIGS. 1a, 1b, showing two ways in which the valve assembly may be provided with means for damping oscillating movements thereof.

FIGS. 3a and 3b show the construction of the valve assembly V1, V4. The valve V1 is provided at its upper end with a frame or plate 30 having the same dimensions as the cross-section of the valve and with an attachment lug 31, fixed to the frame, for suspending the valve assembly. Eight vertical beams 32–39 are fixed by their upper ends to the frame 30. The beams are made of electrically insulating material, for example glass-fibre laminate. At their lower ends the beams 32–39 are constructed as fixing members (e.g. 36'–39') for attachment of corresponding vertical beams of the valve V4, for example with the aid of bolts.

One or more spacers 50 are fixed between the beams 34 and 36, and one or more spacers 51 are fixed between the beams 35 and 37.

The valve V1 comprises twelve thyristor modules M11–M16 and M11'–M16' (only some of which are shown in the Figures). Each module constitutes a mechanically self-supporting unit and comprises, for example, four series-connected thyristors with auxiliary equipment (control and indicating circuits, voltage divider elements, etc.). The modules are arranged in pairs (e.g. M16 and M16') at the same level in the valve and on opposite sides of the valve. The modules are inserted from the side between the vertical beams 32, 33 and 38, 39 and towards the vertical beams 34, 35 and 36, 37 and are fixed thereto, for example by bolts. Thus, the modules are supported by the vertical beams 32–39 of the valve and at the same time stiffen the entire valve.

As is clear from FIG. 3b, the two modules M16 and M16' arranged at the same level are connected on the left-hand side to a current conductor 52. The module M16' is connected on the right-hand side by a conductor 53 to the module located immediately below the module M16 (in this case the module M41 in the valve V4). The module M16 is connected on the right-hand side by a conductor 54 to the module located immediately above the module M16' (the module M15', not shown). The current path through the valve assembly thus passes helically from the lowermost module (M46') of the assembly to its uppermost module (M11).

The valve V4 is constructed in substantially the same way as the valve V1, having eight vertical beams (four of which, designated by the numerals 46–49 can be seen in FIG. 3a) of, for example, glass-fibre laminate, which support twelve thyristor modules M41–M46, M41'–M46' (only some of which are shown in FIG. 3a). The upper ends of the beams are constructed as fixing members (e.g. 48' and 49') for attachment directly to the corresponding beams of the valve V1. A frame, corresponding to the frame 30 of the valve V1, is therefore not necessary.

It has been described above how a valve assembly is constructed of two sections located one above the other, each section then consisting of one valve. The division of the assembly into one or more sections may, of course, be done differently, for example such that each section consists of part of a valve or of more than one valve.

Each valve or section may be provided with means (not shown) for, for example, auxiliary power, control or indication, said means being common to several modules.

Each valve assembly may be suspended so that it may oscillate substantially freely (for small oscillating movements). However, the valve assembly is suitably provided with damping members for damping the oscillating movements relative to the other valve assemblies (as in FIG. 1) or relative to the base A. For damping movements relative to the base A, dampers 61 and 62 of, for example hydraulic type, as shown in FIG. 4a, may be arranged to connect the base A and the valve assembly V1, V4 via insulator chains 63 and 64.

FIGS. 1a and 3a show how each valve assembly is suspended using a single lug (item 31 in FIG. 3a) and one suspension insulator (item 6 in FIG. 1a). As an alternative, the suspension member of each assembly may be multiplied, for example doubled, to increase the safety and to prevent rotational oscillations of the assembly.

FIG. 4b shows an alternative way of damping the oscillating movements of a valve assembly. Here the assembly is suspended from a yoke 7 fixed to the beam 1. Two resilient and movement-damping members 71 and 72 are attached to the yoke 7, which members may be pneumatic and/or hydraulic shock absorbers, possibly in combination with mechanical spring elements. The valve assembly is suspended from the members 71 and 72 via suspension insulators 6' and 6" which are fixed to lugs 31' and 31", respectively, on the valve assembly. This arrangement results in a resilience to vertical forces and damping of vertical oscillating movements.

The means shown in FIGS. 4a and 4b only damp movements in one plane, but they may of course be duplicated so that damping is obtained of oscillating movements independent of their direction.

Instead of allowing the valve assemblies to oscillate independently of one another, they may be connected to each other, as shown in FIG. 5, so that they behave as a rigid unit, at least for some oscillations in the plane of the paper. This may be achieved by connecting the three valve assemblies, for example at their lower ends, by means of rods 81 and 82. The rods may constitute the electrical connecting conductors between the valve assemblies (i.e. items 13, 14 in FIG. 1). As an alternative, of course, separate connecting conductors 13 and 14 may be arranged (as shown in dashed lines in FIG. 5) in addition to the rods 81, 82.

The damping members 11 and 12 arranged between the assemblies in FIG. 1 may at the same time serve as electrical connections between the assemblies. FIG. 6 shows how the assemblies are connected by way of metallic rods 91, 92 and a damper 93. The rods 91, 92 and possibly the damper constitute the electrical connection between the assemblies. If the electrical current path through the damper is interrupted by a layer of a non-conducting material, the damper may be electrically bridged by means of a line 94.

As is clear from the above description, the valves in a valve assembly are substantially subjected to tensile stresses only. These may be taken up in a simple manner, for example by the through-going vertical beams of glass-fibre laminate or the like, described above, said beams being relatively insensitive to bending, rotation and other deformations. Thus, the suspended valve assembly forms a strong, and to a certain extent flexible, unit, which gives the assembly a very great resistance to the forces on the assembly caused by movements of the suspension point of the assembly or of the base of the converter.

The oscillation-damping and resilient members for suspending the valve assemblies result in a very considerable reduction of the mechanical stresses on the assemblies. By constructing the members with a sufficiently great flexibility and a suitable damping, the movements of a valve assembly caused by movements of the base can be considerably reduced. Therefore, the damping and resilient members constitute an important subsidiary feature of the invention, and their use can contribute considerably to increasing the advantages gained by the invention.

The fragile, heavy, bulky and expensive supporting insulators used in previous valve assemblies are completely eliminated with a converter in accordance with the invention. In addition to the greatly increased mechanical strength of the valve assembly, a considerable economic benefit is therefore obtained in comparison with previously known valve assemblies.

In prior art valve assemblies it has usually been necessary for each valve to comprise a lower frame and supporting insulators positioned on said frame and supporting an upper frame. Between the upper and the lower frame there are arranged supporting members for the rectifier elements. Each valve rests with its lower frame on the upper frame of the valve positioned below it. Alternatively, the confronting frames of two valves may be replaced by a common frame.

In a converter in accordance with the invention, the use of such frames is almost completely avoided. Only at the upper end of the uppermost valve of each valve assembly, may it be necessary to arrange a frame structure (item 30 in FIG. 3a), which is a further contribution to the economic advantages gained by a converter in accordance with the invention.

It has been shown above how the converter may be combined with a special trestle for suspension of the valve assemblies. If sufficiently strong or reinforceable roofs (for suspension in a building) or decks (for marine installations) are used, the trestle may, of course, be dispensed with and the valve assemblies be suspended from the roof or the deck, or possibly from other already existing structures.

FIGS. 7a, 7b and 8a–8c show a twelve-pulse converter arranged in a building 100 or other construction. The converter has three quadruple valve assemblies, the first of which consists of four d.c. series-connected valves V1, V4, V11, V14, the second of which consists of the valves V3, V6, V13, V16, and the third of which consists of the valves V5, V2, V15, V12. The valves V5, V2, V15, V12 are suspended by means of eight electrically insulating rods of glass-fibre reinforced plastics material (only five of which, designated by the numerals 105–109, can be seen in the Figures) which rods may suitably be provided with grooves, channels or threads to increase the electric creep distance in the longitudinal direction of the rods. The upper ends of these eight insulating rods are fixed to a metallic plate 113, which is suspended from eight resilient and movement-damping members 114–121 by means of eight further rods, only five of which, designed 132–135 and 139, can be seen in the Figures. The members 114–121 are supported by four cross-beams 122–125 arranged between beams 103 and 104. Each of the members 114–121 may consist of a combination of a force-absorbing spring element (e.g. mechanical springs or gas suspension) and movement-damping elements (e.g. a hydraulic shock absorber). Because of the resilience a considerable reduction of the forces acting on the valves is obtained, and the damping elements provide a damping of the movements of the valve assembly. The other two quadruple valve assemblies are suspended in a corresponding manner.

The upper and lower ends of the valve assemblies and their mid-points are electrically connected to each other by means of lines 126–131. In this way the valves V1–V6 form an upper three-phase bridge and the valves V11–V16 form a lower bridge, and the two bridges are connected in series on their d.c. sides. The upper end points of the valve assemblies are connected to one d.c. lead 142 of the converter and their lower end points are connected to the other d.c. lead 143. These leads and the six a.c. leads (two of which, designated by the numerals 140, 141, can be seen in FIG. 7b), may consist of lines or other flexible connecting members.

Each valve assembly may thus move relatively freely with respect to the base A, to the building 100 and to the other valve assemblies. Vertical movements and oscillating movements of the valve assemblies with respect to the building 100 are taken up and damped by the damping members, for example members 114–121. Purely horizontal movements are taken up by bending of the flexible insulating suspension rods, for example the rods 105–109. Each valve assembly will thus be suspended in a largely immobile manner, independently of movements of the base A and of the building 100. The mechanical stresses on the valve assemblies will thus to a great extent be reduced.

Figure 7A:
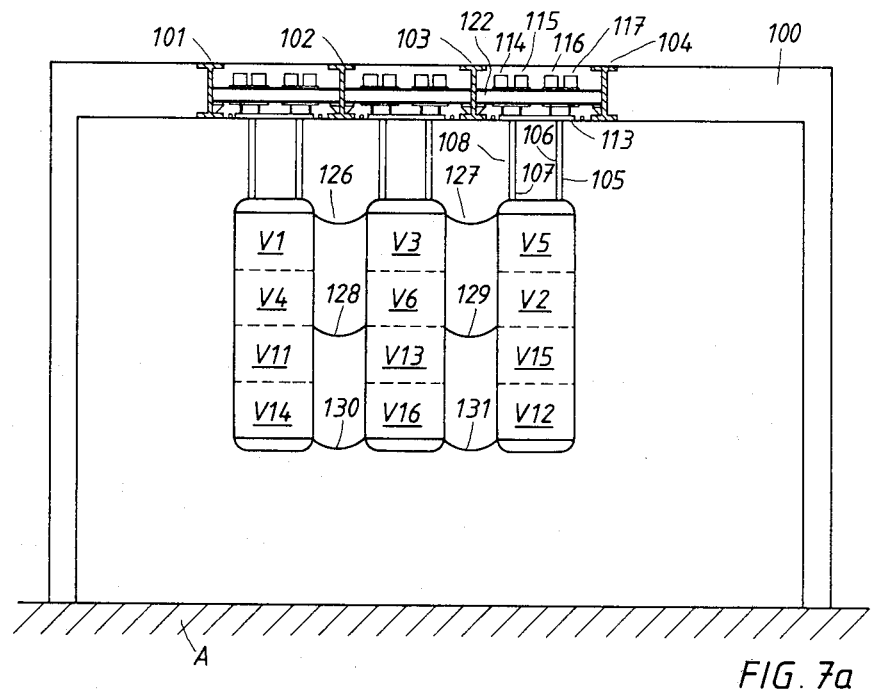
FIG. 7a is a front elevation view, similar to FIG. 1a, of a second embodiment of a static electrical converter in accordance with the invention.
Figure 7B:
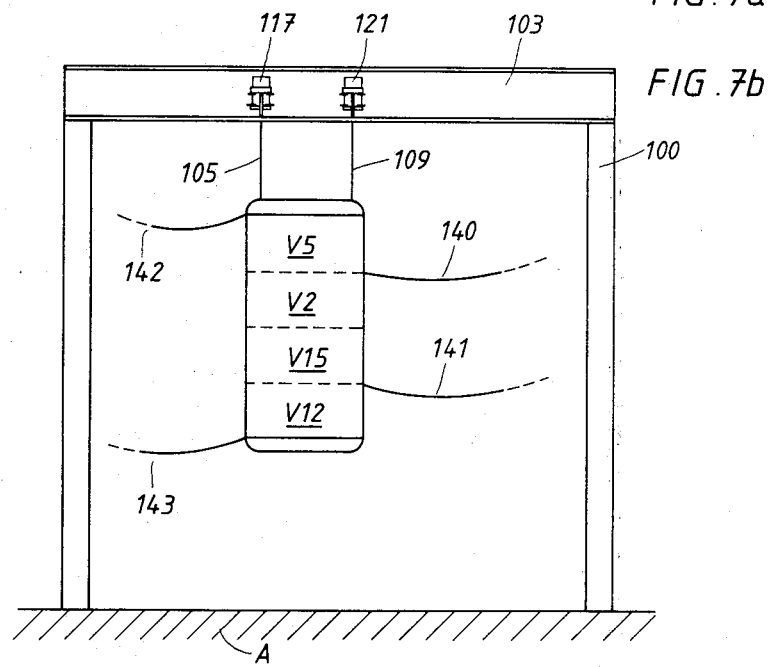
FIG. 7b is an end view corresponding to FIG. 7a, FIG. 8a is a detail, on an enlarged scale of part of FIG. 7a, FIG. 8b is a plan corresponding to FIG. 8a, FIG. 8c is an end view of the detail shown in FIG. 8a, FIG. 9a is an end view, on an enlarged scale, of one of the valve assemblies of the converter of FIGS. 7a, 7b.
Figure 8A:
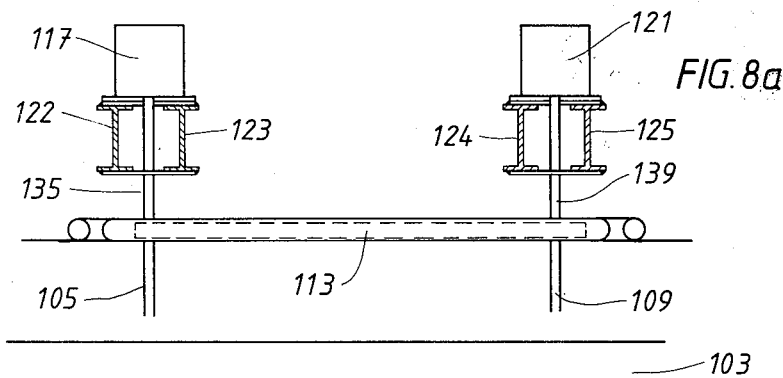
Figure 8B:
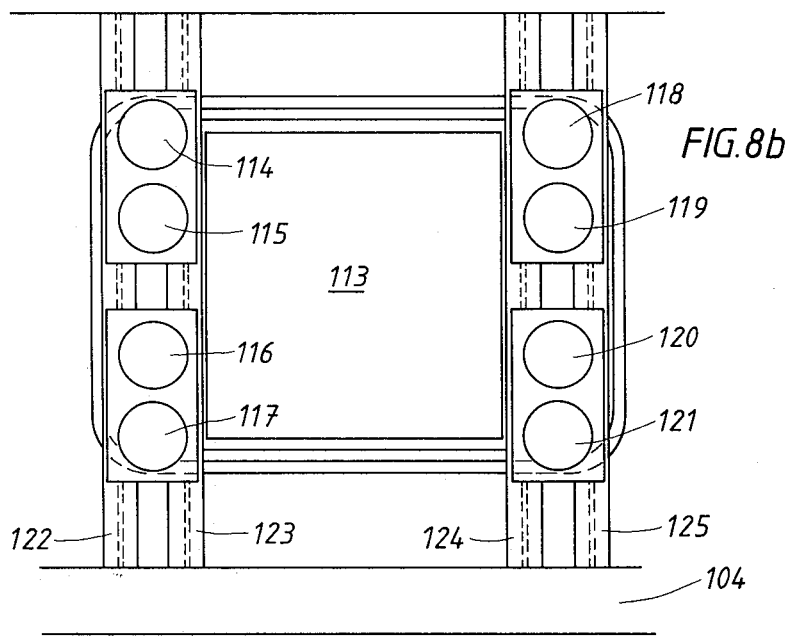
Figure 8C:
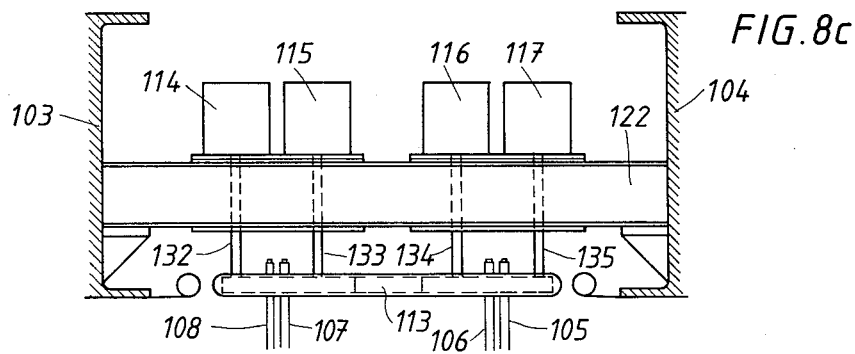
Figure 9A:
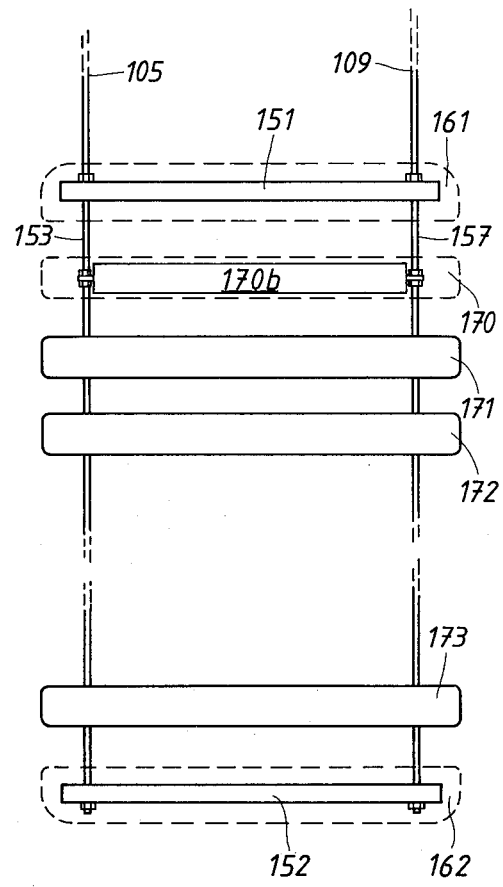
Figure 9B:
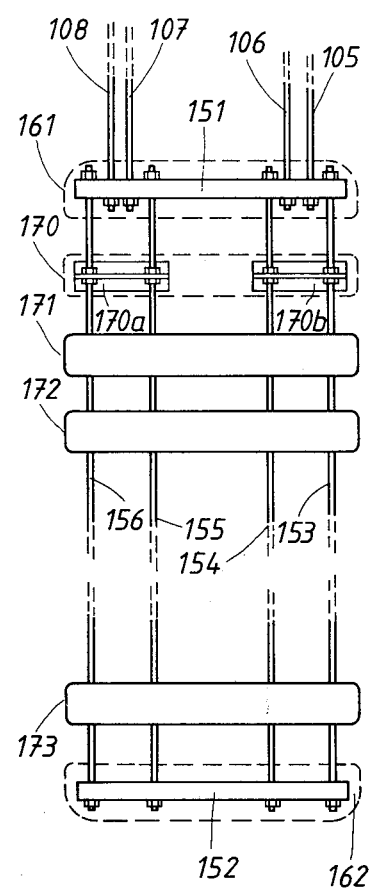

FIGS. 9a and 9b show one of the valve assemblies of FIGS. 7a, 7b in two views at right angles to each other. The valve assembly consists of a large number of "storeys", of which four (designated by the numerals 170–173) are shown in the Figures. Each "storey" (e.g. 170) comprises two thyristor modules (170a and 170b), which are surrounded by an electrostatic screen (shown with a broken line for the storey 170, and with unbroken lines for the other storeys). The valve assembly has an upper frame 151 and a lower frame 152, which are surrounded by electrostatic screens 161 and 162. The lower ends of the eight electrically insulating suspension rods (again, only five of which, designated by the numerals 105–109, can be seen in the Figures) are fixed to the upper frame 151, for example by the frame being allowed to rest on nuts which are applied on the lower, screw-threaded ends of the rods. The thyristor modules and the lower frame 152 are supported by eight rods of glass-fibre reinforced plastics material (only five of which, designated by the numerals 153–157, can be seen in the Figures). These rods are screw-threaded along their entire length and provided with nuts above the upper frame 151 and below the lower frame 152. The thyristor modules have attachment lugs which are fixed to the rods by means of nuts. Because the rods are screw-threaded and provided with nuts for fixing the thyristor modules, considerable advantages are obtained. The screw-threading gives the rods a grooved surface, which increases the electric creep distance along the rods, and so considerably reduces the height of the valve assembly. Furthermore the distance between the thyristor modules may be adjusted in a simple manner to a value suitable for the desired operating voltage.

The thyristor modules are only schematically shown. Each module may, for example, be constructed in the manner shown in FIG. 1 of U.S. Pat. No. 4,178,630.

The electric connections between the thyristor modules are not shown in FIGS. 9a, 9b. They are suitably made in the manner described in connection with FIG. 3a, that is, such that all the thyristor modules in the valve assembly are series-connected.

The embodiment shown in FIGS. 7a–9b provides an extremely simple and advantageous solution to the construction and suspension of the valve assemblies. Considerable practical and economic benefits are gained in the form of reduced dimensions, simpler construction and greatly increased mechanical strength.

In the above description three-phase converters, which thus have three valve assemblies, have been described. The invention is, of course, applicable to converters of arbitrary types and having an arbitrary number of phases and of valve assemblies. Thus, a converter in accordance with the invention may consist of, for example, a direct converter, of a d.c. voltage converter, or quite simply of two anti-parallel connected valves for switching on and off an a.c. load. The rectifier elements of each valve in the converter may alternatively consist of thyristors or diodes, or of a combination of such elements.

A converter in accordance with the invention may consist of two or more series-connected bridges, and the number of valves for each valve assembly is then four or more.

The valve assemblies described above with reference to FIGS. 3a, 3b and 9a 9b, are only examples and a great number of other embodiments are feasible within the scope of the invention. Thus, the number of modules may differ from that shown, and more modules or fewer modules than two may be arranged at each level. The number of vertical beams and their construction and material may, of course, be different, as may the attachment and orientation of the modules.

It is self-evident that the means for damping oscillating movements, when provided, may be constructed differently from what has been shown. They may be fixed to the valve assembly in one or more suitable points which do not have to be located at the very bottom of the assembly. Damping members for damping movements relative to the base may be combined in a suitable manner with members for damping relative movements between the assemblies, or with members which rigidly connect the assemblies to each other.

Not only the electric connections between the valve assemblies, but also, or as an alternative, the external connections (e.g. 15, 16, 20) of the converter may be constructed for damping oscillating movements.

Auxiliary connections (cables, hoses, tubes, light conductors, etc.) for cooling and controlling a valve assembly and for removing measurement and indication signals may be connected to the upper or lower end of the assembly, or possibly to the side of the assembly.

What is claimed is:

1. A static electrical converter for high voltage direct current power transmission comprising at least one valve assembly having a single valve or a plurality of electrically series-connected valves, each valve comprising a plurality of electrically series-connected rectifiers, and suspension means at the upper end of said valve assembly for permanently mounting the valve assembly suspended from a supporting structure, said suspension means comprising resilient means permitting relative movement in a vertical direction between the valve assembly and said supporting structure.

2. A converter according to claim 1, in which said suspension means comprises elongated electrically insulating support members having upper ends fastened to said resilient means and their lower ends fastened to said valve assembly, said resilient means being arranged to be mounted on said supporting structure.

3. A converter according to claim 1 or 2, comprising means mechanically connected to said valve assembly for damping oscillating movements of said valve assembly.

4. A converter according to claim 1 or 2, in which said suspension means comprises oscillation-damping means.

5. A converter according to claim 1 or 2, in which electrical connections to said assembly are constructed so that the valve assembly is able to oscillate substantially freely.

6. A converter according to claim 1, in which said suspension means comprises elongated electrically insulating suspension members, which are connectible by their upper ends to a supporting structure and the lower ends of which are attached to said valve assembly.

7. A converter according to claim 6, in which said suspension members are constructed of glass-fibre-reinforced plastics material.

8. A converter according to claim 7, in which said suspension rods are provided with transverse grooves or threads to increase the electric creep distance along the rods.

9. A converter according to claim 1 or 2, in which said valve assembly comprises a plurality of valve modules and a plurality of electrically insulating supporting rods arranged in the longitudinal direction of said valve assembly, said valve modules being attached to said rods.

10. A converter according to claim 9, in which said supporting rods are constructed of glass-fibre-reinforced plastics material.

11. A converter according to claim 9, in which said supporting rods are provided with transverse grooves or threads to increase the electric creep distance along the rods.

12. A converter according to claim 11, in which said supporting rods are screw-threaded and provided with threaded-on nuts to support said valve modules.

13. A converter according to claim 9, in which said valve assembly has an upper frame arranged at the upper end of the assembly and a lower frame arranged at the lower end of the assembly, said supporting rods being attached to said upper frame by their upper ends and being attached to said lower frame by their lower ends.

14. A converter according to claim 6, in which said valve assembly comprises a plurality of valve modules and a plurality of electrically insulating supporting rods arranged in the longitudinal direction of said valve assembly, said valve modules being attached to said rods.

15. A converter according to claim 14, in which said valve assembly has an upper frame arranged at the upper end of the assembly and a lower frame arranged at the lower end of the assembly, said supporting rods being attached to said upper frame by their upper ends and being attached to said lower frame by their lower ends.

16. A converter according to claim 15, in which said suspension rods are attached by their lower ends to said upper frame.

17. A converter according to claim 1 or 2 in combination with a supporting structure, said supporting structure being mountable on a base and comprising a supporting portion for suspension of said valve assembly.

* * * * *

UNITED STATES PATENT AND TRADEMARK OFFICE
CERTIFICATE OF CORRECTION

PATENT NO. : 4,318,169
DATED : March 2, 1982
INVENTOR(S) : Olsson

It is certified that error appears in the above-identified patent and that said Letters Patent is hereby corrected as shown below:

In Col. 9, Claim 8, line 2, "rods" should be -members-, and

In Col. 10, Claim 16, line 2, "rods" should be -members-.

Signed and Sealed this

Ninth Day of July 1985

[SEAL]

Attest:

DONALD J. QUIGG

Attesting Officer     Acting Commissioner of Patents and Trademarks